United States Patent
Peitzsch et al.

(10) Patent No.: US 11,670,532 B1
(45) Date of Patent: Jun. 6, 2023

(54) SYSTEM AND METHOD FOR CONTROLLING ELECTROSTATIC CLAMPING OF MULTIPLE PLATENS ON A SPINNING DISK

(71) Applicant: Applied Materials, Inc., Santa Clara, CA (US)

(72) Inventors: Scott E. Peitzsch, Tewksbury, MA (US); Robert Mitchell, Winchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/543,150

(22) Filed: Dec. 6, 2021

(51) Int. Cl.
- H01L 31/00 (2006.01)
- H01L 21/683 (2006.01)
- H01J 37/20 (2006.01)
- H01J 37/317 (2006.01)

(52) U.S. Cl.
CPC .......... *H01L 21/6833* (2013.01); *H01J 37/20* (2013.01); *H01J 37/3171* (2013.01); *H01J 2237/002* (2013.01); *H01J 2237/0473* (2013.01); *H01J 2237/2007* (2013.01); *H01J 2237/20214* (2013.01)

(58) Field of Classification Search
CPC ............. H01L 21/6831; H01L 21/6833; H01L 21/67103; H01L 21/67109; H01G 7/02
See application file for complete search history.

(56) References Cited

U.S. PATENT DOCUMENTS

| | | | |
|---|---|---|---|
| 8,330,126 B2 * | 12/2012 | Henley | ............. H01L 21/67213 |
| | | | 250/492.1 |
| 2010/0327181 A1 | 12/2010 | Ryding et al. | |
| 2016/0104634 A1 * | 4/2016 | Lee | ...................... H01L 21/6831 |
| | | | 269/21 |
| 2018/0277418 A1 | 9/2018 | Sato et al. | |
| 2020/0043703 A1 | 2/2020 | French et al. | |

FOREIGN PATENT DOCUMENTS

| JP | 2014-11272 A | 1/2014 |
|---|---|---|
| KR | 2005-0078719 A | 8/2005 |

OTHER PUBLICATIONS

International Search Report and Written Opinion dated Feb. 16, 2023 in corresponding PCT application No. PCT/US2022/047349.

* cited by examiner

*Primary Examiner* — David E Smith
*Assistant Examiner* — Hsien C Tsai
(74) *Attorney, Agent, or Firm* — Nields, Lemack & Frame, LLC

(57) ABSTRACT

A system and method for controlling electrostatic clamping of multiple platens on a spinning disk is disclosed. The system comprises a semiconductor processing system, such as a high energy implantation system. The semiconductor processing system produces a spot ion beam, which is directed to a plurality of workpieces, which are disposed on a spinning disk. The spinning disk comprises a rotating central hub with a plurality of platens. The plurality of platens may extend outward from the central hub and workpieces are electrostatically clamped to the platens. The central hub provides the electrostatic clamping voltages to each of the plurality of platens. Further, the plurality of platens may also be capable of rotation about an axis orthogonal to the rotation axis of the central hub. The central hub controls the rotation of each of the platens. Power connections and communications are provided to the central hub via the spindle assembly.

18 Claims, 6 Drawing Sheets

SYSTEM AND METHOD FOR CONTROLLING ELECTROSTATIC CLAMPING OF MULTIPLE PLATENS ON A SPINNING DISK

FIELD

Embodiments of this disclosure are directed to systems and methods for controlling electrostatic clamping of multiple platens on a spinning disk.

BACKGROUND

High energy implantation systems are used to create semiconductor devices that have deep implanted regions. One specific type of device is referred to as an insulated gate bipolar transistor (IGBT). An IGBT combines concepts from bipolar transistors and MOSFETs to achieve an improved power device. The emitter and the gate are disposed on one side of the device, while the collector is disposed on the opposite second side of the device. The emitter is in communication with a heavily p-doped region disposed directly below the emitter. On either side of the heavily p-doped region are heavily n-doped regions, each in communication with the gate. Beneath the heavily p-doped region is a lightly p-doped region. On the opposite side of the device is a second heavily p-doped region, in communication with the collector. Finally, between the second heavily p-doped region and the lightly p-doped region is a lightly n-doped drift layer.

In conventional IGBT devices, the thickness of the lightly n-doped drift layer is determined based on the need to sustain the electrical field. As the power ratings for these devices increases, the overall thickness of the device also increases.

High energy implants may be used to create these devices. However, one shortcoming of this approach may be angular spread. Traditionally, in these implantation systems, a spot beam is generated, which is then electrostatically scanned to create a ribbon ion beam that strikes the workpiece. However, non-uniformities in angular spread may be exacerbated by the electrostatic scanner.

Therefore, it would be beneficial if there were a semiconductor processing system that could perform high energy implants without the drawbacks of the present technologies. More particularly, it would be beneficial if there were a system that performs high energy implants on a batch of workpieces that are electrostatically clamped.

SUMMARY

A system and method for controlling electrostatic clamping of multiple platens on a spinning disk is disclosed. The system comprises a semiconductor processing system, such as a high energy implantation system. The semiconductor processing system produces a spot ion beam, which is directed to a plurality of workpieces, which are disposed on a spinning disk. The spinning disk comprises a rotating central hub with a plurality of platens. The plurality of platens may extend outward from the central hub and workpieces are electrostatically clamped to the platens. The central hub provides the electrostatic clamping voltages to each of the plurality of platens. Further, the plurality of platens may also be capable of rotation about an axis that is orthogonal to the rotation axis of the central hub. The central hub also controls the rotation of each of the platens. Power connections and communications are provided to the central hub via the spindle assembly.

According to one embodiment, a spinning disk to process a plurality of workpieces is disclosed. The spinning disk comprises a central hub adapted to rotate; a plurality of platens attached to the central hub, each platen comprising a plurality of electrodes and configured to electrostatically clamp a respective workpiece; an electrode power system disposed within the central hub to receive a power signal and generate electrode signals to power the plurality of electrodes disposed within each of the plurality of platens to provide electrostatic clamping; and a spindle assembly connecting the central hub to a structure, wherein the power signal is passed through the spindle assembly to the electrode power system. In some embodiments, the power signal is less than 500V. In certain embodiments, the power signal is 24V. In some embodiments, the signals generated by the electrode power system to power the plurality of electrodes have an amplitude of greater than or equal to 200V. In some embodiments, the amplitude is between 200 and 4000 V. In some embodiments, the electrode power system comprises an electrode power supply that creates N*P electrode signals, where N is a number of electrodes disposed in each platen and P is a number of platens. In some embodiments, the electrode power system comprises a plurality of electrode power supplies, wherein the plurality of electrode power supplies create N*P electrode signals, where N is a number of electrodes disposed in each platen and P is a number of platens. In certain embodiments, the plurality of electrode power supplies comprises P electrode power supplies. In certain embodiments, the electrode power system generates N signals, where N is a number of electrodes, and each of the N signals is branched and distributed to a respective electrode in each platen, and wherein each branch comprises a current sensor, such that there are N*P current sensors, wherein P is a number of platens.

According to another embodiment, an ion implantation system is disclosed. The ion implantation system comprises an ion source; an accelerator to accelerate ions from the ion source; and the spinning disk described above.

According to another embodiment, a spinning disk to process a plurality of workpieces is disclosed. The spinning disk comprises a central hub adapted to rotate; a plurality of platens attached to the central hub, each platen comprising a plurality of electrodes and configured to electrostatically clamp a respective workpiece; a hub controller disposed within the central hub; and a spindle assembly connecting the central hub to a structure, wherein communication signals are passed through the spindle assembly to the hub controller. In some embodiments, the spinning disk comprises a fluid gas conduit passing through the spindle assembly and a gas valve disposed in the central hub, wherein the hub controller controls the gas valve to regulate a flow of backside gas to the plurality of platens. In some embodiments, the spinning disk comprises an inlet coolant conduit and an outlet coolant conduit passing through the spindle assembly. In some embodiments, the spinning disk comprises a coolant valve disposed in the central hub, wherein the hub controller controls a temperature of the plurality of platens by controlling the coolant valve. In some embodiments, the spinning disk comprises a thermal sensor disposed in a platen, wherein the hub controller controls the temperature of the platen based on information from the thermal sensor. In some embodiments, the spinning disk comprises comprising a thermal sensor disposed in a platen, wherein the hub controller passes temperature information about the plurality of platens using the communication signals and a temperature of a coolant is controlled based on the temperature information. In some embodiments, the spinning disk comprises spokes extending radially from the central hub, wherein one of the plurality of platens is disposed at a distal end of each spoke, wherein the spokes are configured to rotate about an axis that extends radially from the central hub, and the spinning disk comprises a plurality of rotary motors, each in communication with a respective spoke, wherein the hub controller controls a rotation of each spoke.

According to another embodiment, an ion implantation system is disclosed. The ion implantation system comprises an ion source; an accelerator to accelerate ions from the ion source; and the spinning disk described above.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes the use of a spinning disk in conjunction with a semiconductor processing system to implant ions with high energy and low angular spread. There are various semiconductor processing systems that may be used with the spinning disk.

Figure 1A:
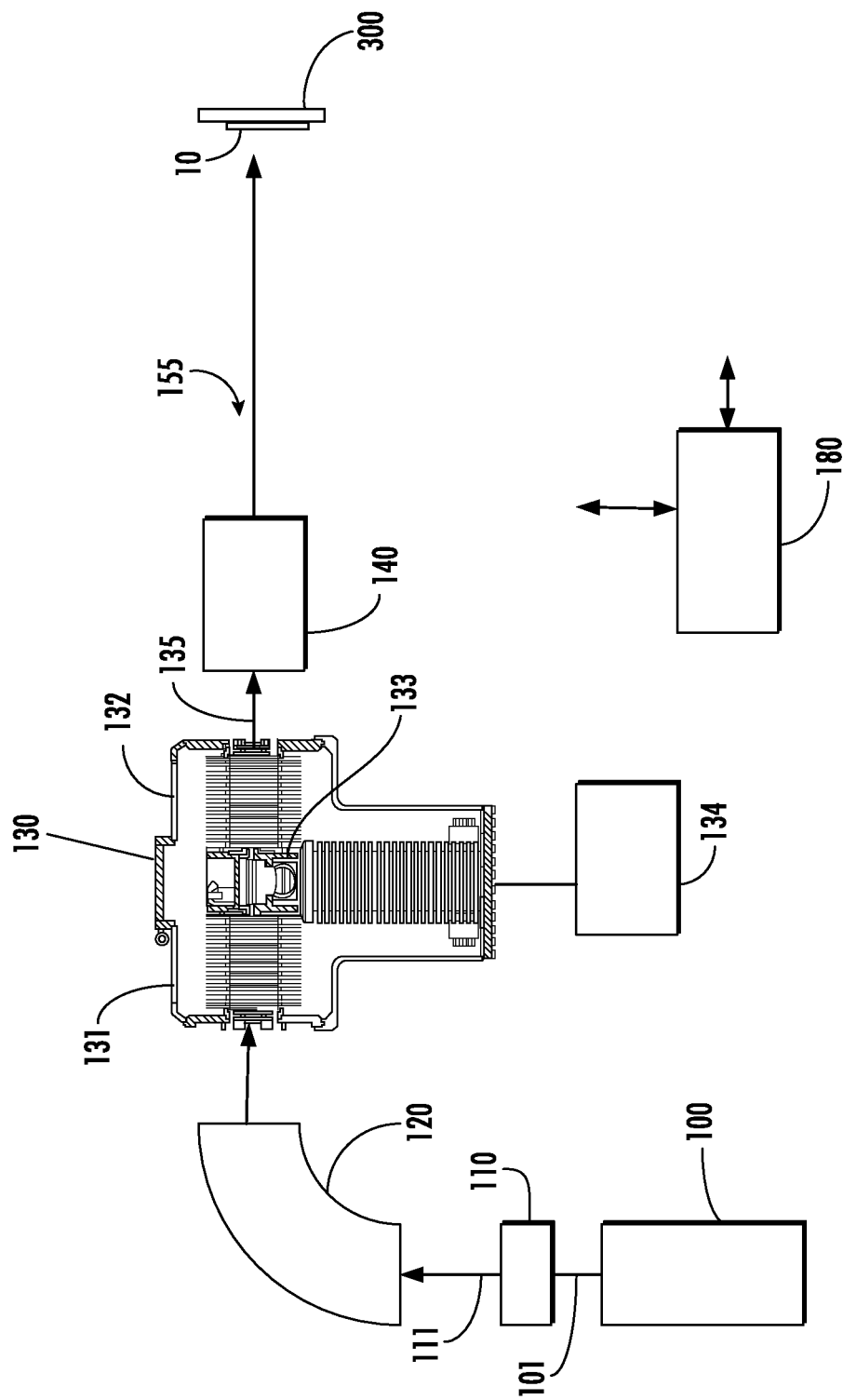
FIG. 1A shows a semiconductor processing apparatus that may be utilized according to one embodiment.

As shown in FIG. 1A, a semiconductor processing system comprises an ion source 100, which is used to generate an ion beam. In one embodiment, a positive ion beam 101 may be created in the traditional manner, such as using a Bernas or indirectly heated cathode (IHC) ion source. Of course, other types of ion sources may also be employed. A feedgas is supplied to the ion source 100, which is then energized to generate ions. In certain embodiments, the feedgas may be hydrogen, boron, phosphorus, arsenic, helium, or other suitable species. Extraction optics are then used to extract these ions from the ion source 100.

The positive ion beam 101 exiting the ion source 100 may be coupled to a Mg charge exchange cell 110, which transforms the positive ion beam 101 into a negative ion beam 111. Of course, other mechanisms for the generation of a negative ion beam are known in the art. The mechanism used to create the negative ion beam is not limited by this disclosure.

The negative ion beam 111 may be directed toward a mass analyzer 120, which only allows the passage of certain species of ions. The negative ions that exit the mass analyzer 120 are directed toward a tandem accelerator 130.

The tandem accelerator 130 has two pathways, which are separated by a stripper tube 133. The input pathway 131 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 133.

The input pathway 131 leads to the stripper tube 133. The stripper tube 133 is biased positively relative to the outermost input electrode. The stripper tube 133 includes an injection conduit where a stripper gas is injected. The stripper gas may comprise neutral molecules. These neutral molecules may be any suitable species such as, but not limited to argon and nitrogen. The stripper tube 133 has an inlet disposed on the same side as the input pathway 131. The outlet of the stripper tube 133 is in communication with the output pathway 132.

In other words, the stripper tube 133 is positively biased so as to attract the negative ion beam 111 through the input pathway 131. The stripper tube 133 removes electrons from the incoming ions, transforming them from negative ions into positive ions.

The stripper tube 133 is more positive than the electrodes in the output pathway 132. Each subsequent output electrode may be less positively biased moving away from the stripper tube 133. For example, the outermost output electrode may be grounded. Thus, the positive ions in the stripper tube 133 are accelerated through the output pathway 132.

In this way, the ions are accelerated two times. First, negative ions are accelerated through the input pathway 131 to the stripper tube 133. This acceleration is based on the difference between the voltage of the outermost input electrode and the voltage of the stripper tube 133. Next, positive ions are accelerated through the output pathway 132. This acceleration is based on the difference between the voltage of the stripper tube 133 and the voltage of the outermost output electrode in the output pathway 132.

An accelerator power supply 134 may be used to supply the voltages to the stripper tube 133, as well as the electrodes in the input pathway 131 and the output pathway 132. The accelerator power supply 134 may be capable of supply a voltage up to 2.5 MV, although other voltages, either higher or lower, are also possible. Thus, to modify the implant energy, the voltage applied by the accelerator power supply 134 is changed.

After exiting the tandem accelerator 130, the positive ion beam 135 may enter a filter magnet 140, which allows passage of ions of only a certain charge. In other embodiments, the filter magnet 140 may not be employed.

The output of the filter magnet, which may be a spot ion beam 155, is then directed toward the spinning disk 300. A workpiece 10 may be disposed on each of the plurality of platens disposed on the spinning disk 300. In certain embodiments, a corrector magnet may be disposed between the filter magnet 140 and the spinning disk 300.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the accelerator power supply 134, so as to control the implant energy. In addition, the controller 180 may be in communication with the spinning disk 300 as described in more detail below. The controller 180 may also be in communication with other components.

Figure 1B:
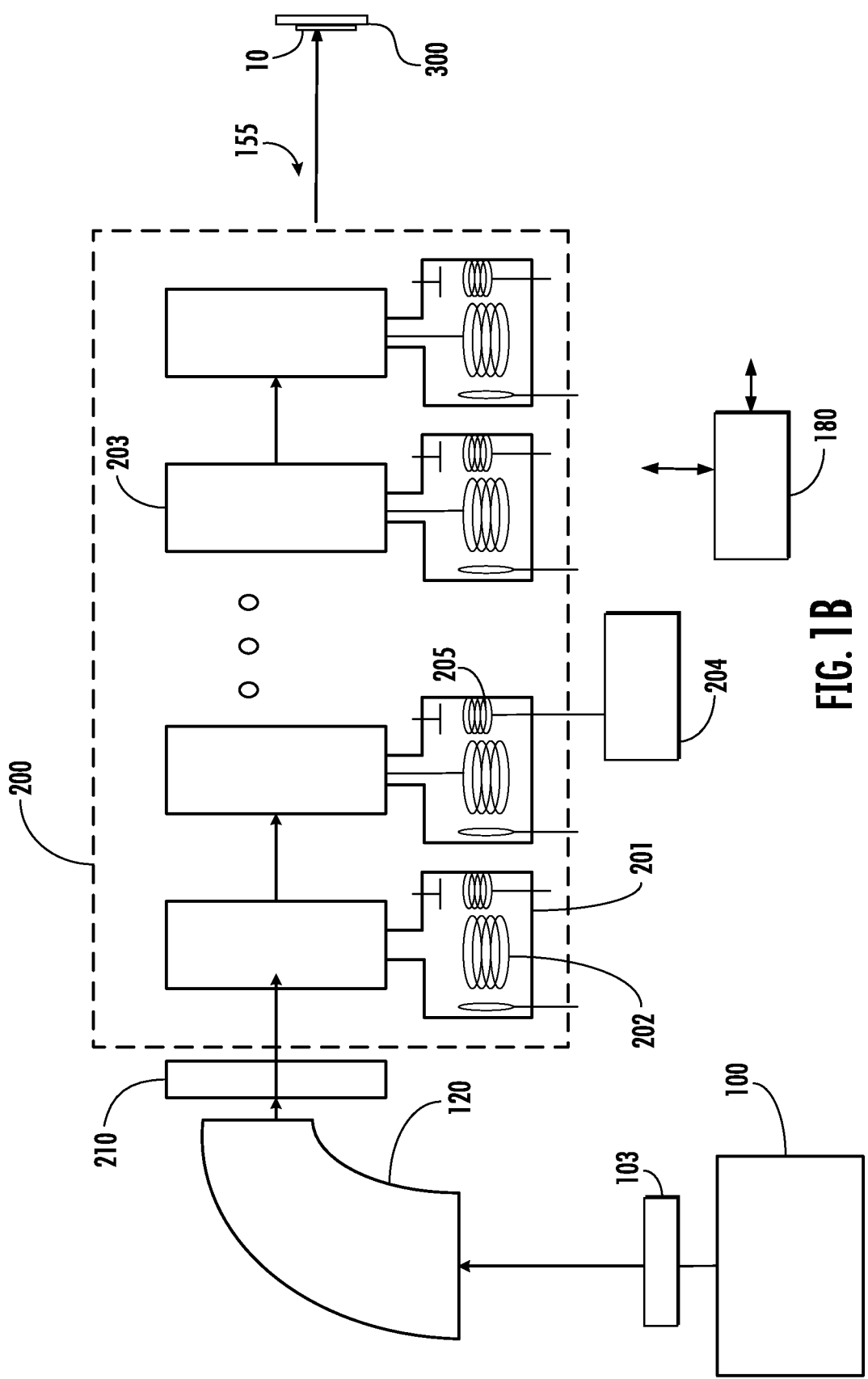
FIG. 1B shows a semiconductor processing apparatus that may be utilized according to a second embodiment.

A second embodiment is shown in FIG. 1B. Components that are common with FIG. 1A are given identical reference designators.

As described above, a semiconductor processing system comprises an ion source 100, which is used to generate an ion beam. The ion source 100 has an aperture through which ions may be extracted from the ion source 100. These ions may be extracted from the ion source 100 by applying a negative voltage to the extraction optics 103 disposed outside the ion source 100, proximate the extraction aperture. The ions may then enter a mass analyzer 120, which may be a magnet that allows ions having a particular mass to charge ratio to pass through. This mass analyzer 120 is used to separate only the desired ions. It is the desired ions that then enter the linear accelerator 200.

The desired ions then enter a buncher 210, which creates groups or bunches of ions that travel together. The buncher 210 may comprise a plurality of drift tubes, wherein at least one of the drift tubes may be supplied with an AC voltage. One or more of the other drift tubes may be grounded. The drift tubes that are supplied with the AC voltage may serve to accelerate and manipulate the ion beam into discrete bunches.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode 203 increases the acceleration of the ions.

After the bunch exits the linear accelerator 200, the ions, which may be a spot ion beam 155, are directed toward spinning disk 300.

The controller 180 may be in communication with the RF generator 204, so as to control the implant energy. In addition, the controller 180 may be in communication with the spinning disk 300 as described in more detail below. The controller 180 may also be in communication with other components.

Of course, the ion implantation system may include other components, such as quadrupole elements, additional electrodes to accelerate or decelerate the beam and other elements.

In both of these embodiments, the ion implantation system comprises an ion source and an accelerator to accelerate the ions. The output from the semiconductor processing system, which may be a spot ion beam 155, is directed toward a spinning disk 300. In certain embodiments, a final energy magnet may be disposed prior to the spinning disk 300 to filter the spot ion beam 155.

Figure 2B:
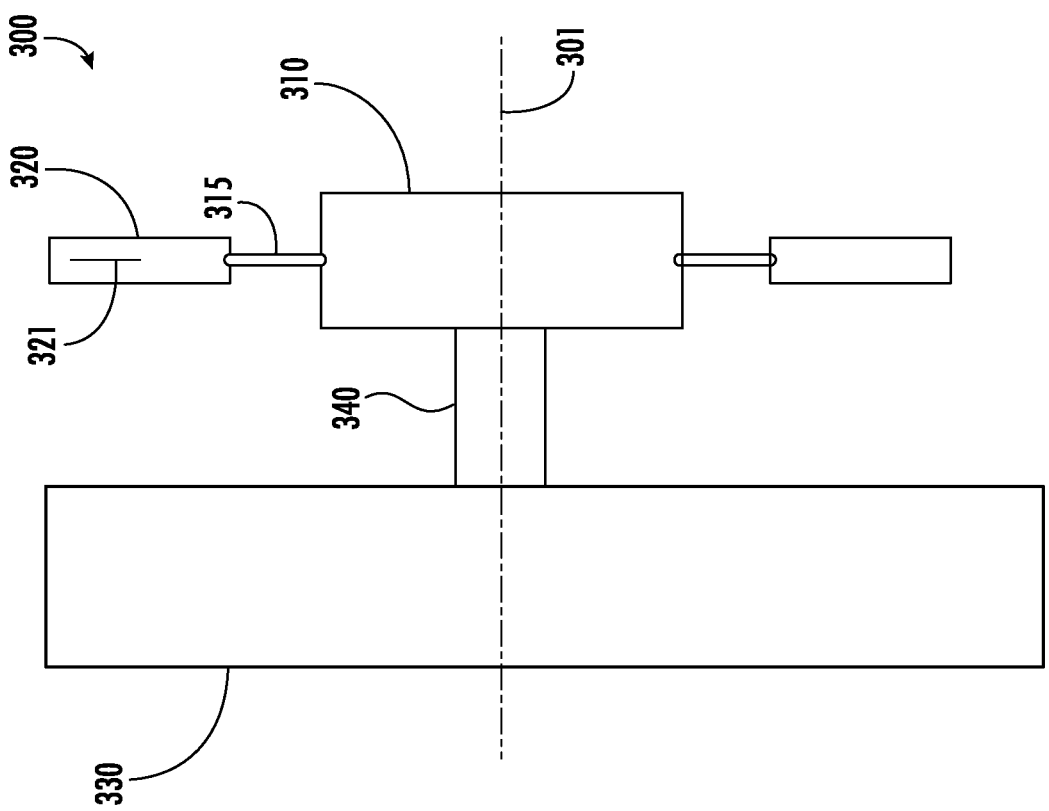
FIG. 2B shows a side view of the spinning disk of FIG. 2A.
Figure 2A:
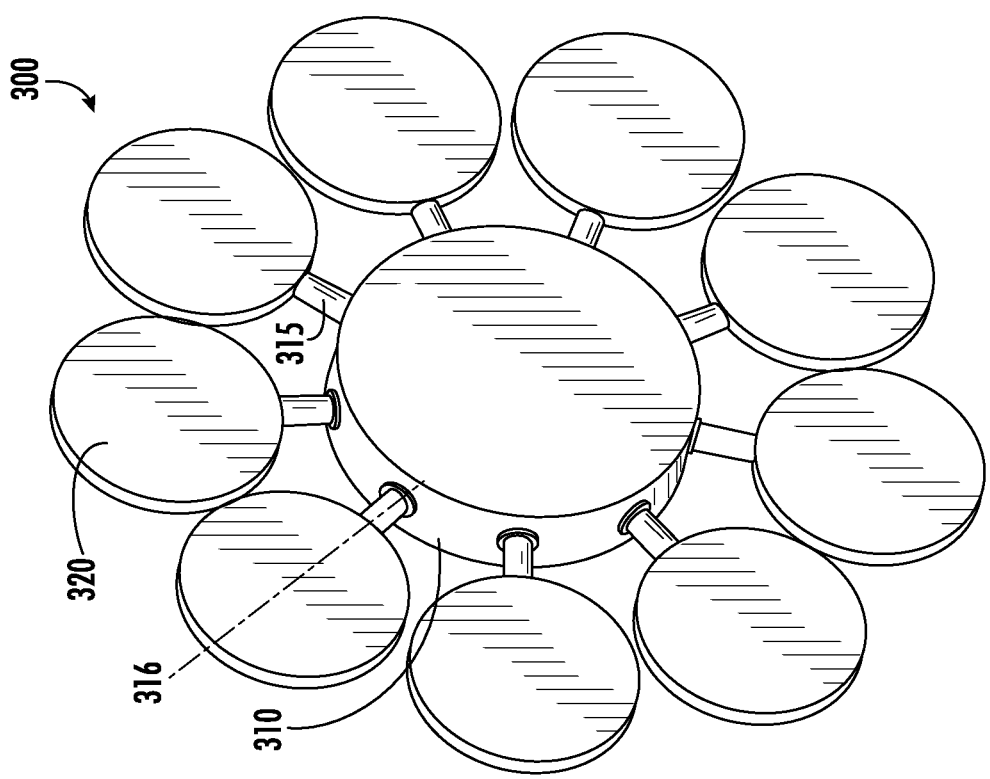
FIG. 2A shows a spinning disk according to one embodiment.

One embodiment of a spinning disk 300 is shown in FIG. 2A. A side view of this spinning disk is shown in FIG. 2B.

The spinning disk 300 comprises a central hub 310, which rotates about a central axis 301. The spinning disk 300 may be connected to a structure 330 using a spindle assembly 340. The structure 330 may be capable of linear translation. For example, the structure 330 may be a movable wall or plate. In another embodiment, the structure 330 may be a pivoting arm. Extending outward from the central hub 310 are a plurality of platens 320. There may be between four and twenty or more platens 320. These platens 320 may each utilize electrostatic clamping. In other words, a plurality of platens are attached to the central hub 310.

The electrostatic clamping may be realized using either AC or DC voltages. In one embodiment, the top surface of the platens may be a dielectric material, such as a ceramic. Beneath the top surface may be a plurality of electrodes 321.

In the case of DC clamping, where may be two electrodes 321, wherein the first electrode is biased at a positive voltage having a predetermined magnitude and the second electrode is biased at a negative voltage having the same magnitude. The electrodes may be suitable shaped. In one embodiment, the two electrodes may be adjacent spirals. The magnitude of the DC voltages may be between 200 and 2000 V.

In the case of AC clamping, there may be an even number of electrodes 321, such as six electrodes. The electrodes 321 may be arranged in opposing pairs, where the phase of the two electrodes of the pair have a phase difference of 180°. Thus, each pair of electrodes may be in electrical communication with a respective bipolar power signal, such as a square wave, such that one electrode of a pair receives the positive output and the other electrode of that pair receives the negative output. The same square wave output, in terms of period and amplitude, is applied to all of the electrodes. However, each square wave output is phase shifted from those adjacent to it. The phase between adjacent electrodes may be equal to 360° C./N, where N is the number of electrodes.

In certain embodiments, the frequency of the AC voltage or pulsed DC voltage may be between 1 and 60 Hz, while the amplitude may be greater than or equal to 200V, such as between 200 and 4000 V. In certain embodiments, there are 6 electrodes, configured as three pairs. One pair of these electrodes is powered by a first square wave, while a second pair of electrodes is powered by a second square wave, which has a phase shift of 120° relative to the first square wave. Similarly, the third square wave is phase shifted 120° from the second square wave. Of course, other configurations are also within the scope of the disclosure.

Each of the platens 320 is connected to the central hub 310 via a respective spoke 315. Within each spoke 315 are the electrical conduits for its respective platen 320. These electrical conduits include the electrical signals needed for the electrostatic clamping. Additionally, each spoke 315 may also carry coolant and backside gas.

Figure 2C:
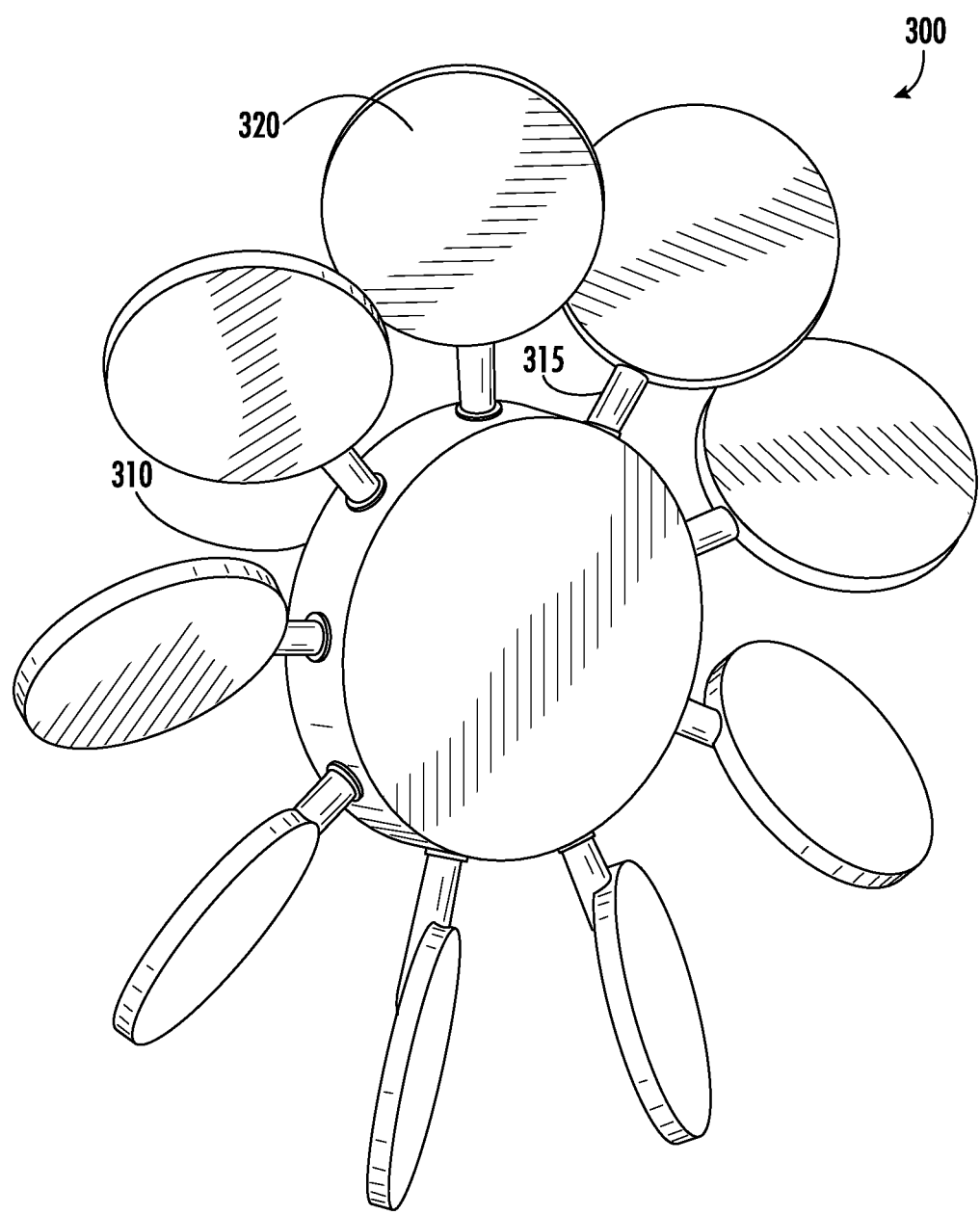
FIG. 2C shows the spinning disk of FIG. 2A where the platens are rotated at an angle.

In certain embodiments, the spoke 315 and the corresponding platen 320 are rigidly attached to one another. Furthermore, in some embodiments, each spoke 315 is capable of rotational movement about an axis 316 that extends radially from the central hub 310. In other words, the spoke 315 can rotate with respect to the central hub 310. Rotation of the spokes 315 is shown in FIG. 2C. The amount of rotation is not limited by this disclosure.

Figure 3:
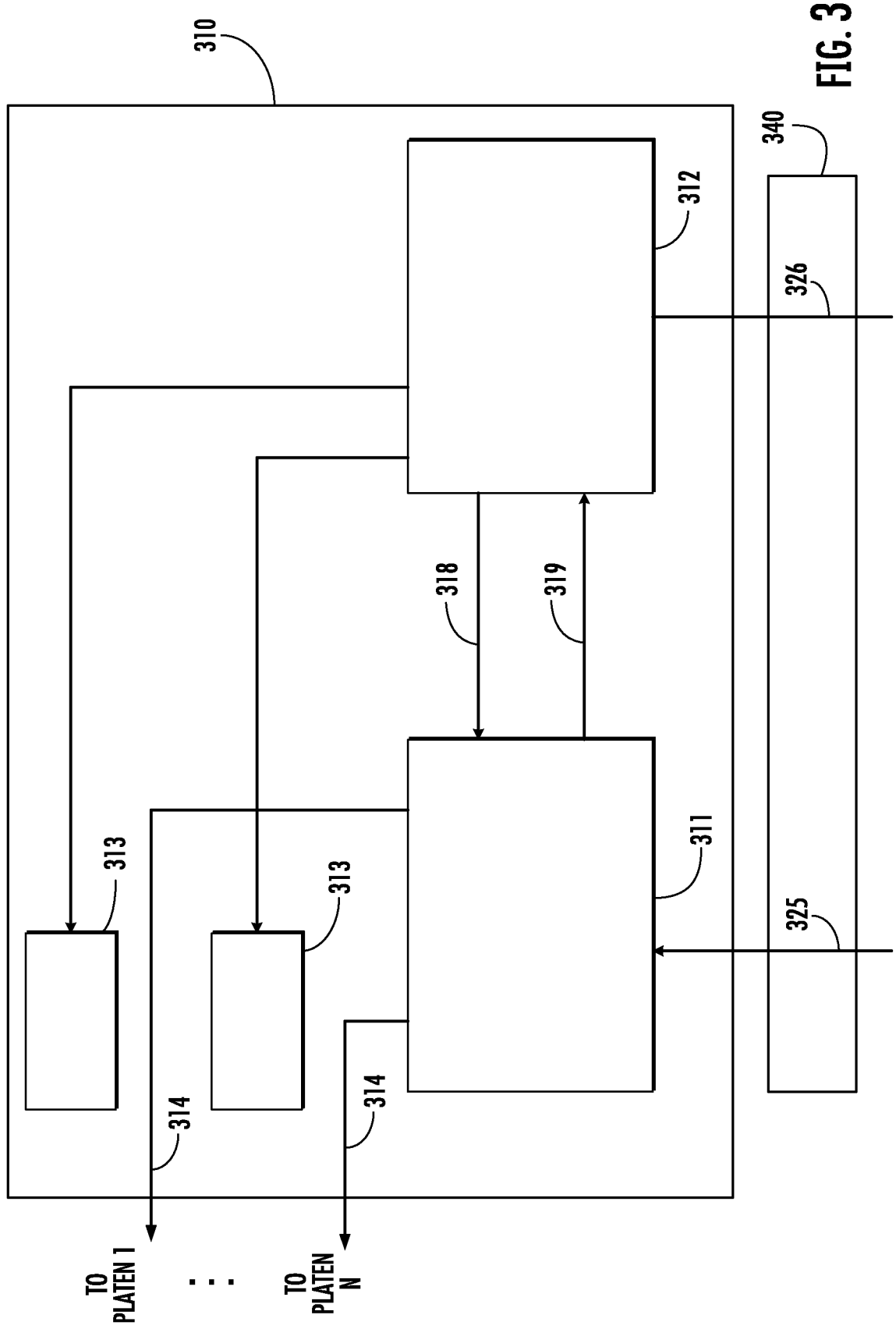
FIG. 3 shows a block diagram of the electrical connections within the central hub.

To control the rotation of the spokes 315, a rotary motor 313 is associated with each spoke 315. A block diagram of the interior of the central hub 310 is shown in FIG. 3.

In this embodiment, a limited number of signals pass through the spindle assembly 340. These signals include one or more power signals 325. In some embodiments, each of the one or more power signals may be less than 120V. In certain embodiments, there may be a single power signal, supplying 24V.

These signals also include ground, and communication signals 326 for the hub controller 312. The communication signals 326 may be associated with any suitable network protocol, such as EtherCAT, Ethernet, Foundation Fieldbus, and others.

In certain embodiments, the number of signals that pass through the spindle assembly 340 may be limited to less than or equal to 16. Further, there are no high voltage signals, defined as voltages greater than 500V, that pass through the spindle assembly 340.

Advantageously, spindle assemblies that are capable of passing 16 signals, where the voltage of each of these signals is less than 500V are readily available. For example, certain spindle assemblies utilize slip rings to pass the electrical signals to the central hub 310.

In other embodiments, the spindle assembly include rotary transformers to couple the signals from the structure 330 to the central hub 310. In this embodiment, the power signals may be AC voltages.

In other embodiments, the spindle assembly may utilize optical transmission to pass at least some of the signals through the spindle assembly.

In other embodiments, the spindle assembly may utilize contactless capacitive transmission to pass at least some of the signals through the spindle assembly.

Within the central hub 310 is an electrode power system 311. The electrode power system 311 receives the power signals 325 from the spindle assembly 340 and generates the electrode signals 314 needed for the electrode 321 in each platen 320. In some embodiments, it may be beneficial to create a separate set of electrode signals 314 for each platen 320. This may be useful in providing diagnostic information to the electrode power system 311 as well as for quickly identifying failures. Further, by having separate electrode signals 314 for each platen 320, the hub controller 312 may also be able to detect the presence of a workpiece on a particular platen 320.

Thus, in one embodiment, the electrode power system 311 comprises one electrode power supply that provides N*P electrode signals, where N is the number of electrodes 321 in each platen 320 and P is the number of platens 320. In another embodiment, the electrode power system 311 comprises a plurality of electrode power supplies. In one embodiment, there may be P separate electrode power supplies, each generating N electrode signals. In yet another, there may be fewer than P electrode power supplies, wherein at least one of the electrode power supplies is providing more than N electrode signals. In each of these embodiments, a total of N*P electrode signals 314 is provided.

In each of these embodiments, there are one or more electrode power supplies in the electrode power system 311 that are used to provide dedicated signals to each of the electrodes 321 in each of the platens 320.

However, other embodiments are also possible. For example, in another embodiment, the electrode power system 311 may comprise one electrode power supply, which is used to generate N signals. Each of the N signals is then branched and distributed to an electrode 321 in each of the platens 320. In certain embodiments, a current sensor is provided in the branch to each platen 320. Thus, while the electrode power system 311 only generates N signals, there are N*P current sensors, which allow the electrode power system 311 to detect and isolate a failure to a specific platen.

By including a current sensor for each electrode 321, the hub controller 312 may be able to also detect the presence of a workpiece on a particular platen.

The techniques to detect the presence of a workpiece or detect a fault based on the current applied to each electrode 321 are known and are not described herein.

Note that the power to each of these electrodes 321 in each of the platens was generated within the central hub 310, allowing far fewer signals to be passed through the spindle assembly 340. Further, this also implies that any noise or electrical disturbances that would result from using a slip ring or equivalent technology to pass high voltage signals to the platen will not disrupt proper platen operation or impede the ability to perform diagnostics on these signals.

Additionally, as described above, the spokes 315 may rotate with respect to the central hub 310. Therefore, rotary motors 313, one for each platen 320, are also included in the central hub 310. To minimize the number of signals passing through the spindle assembly 340, a hub controller 312 is disposed within the central hub. The hub controller 312 may include a processing unit, such as a microcontroller, a personal computer, a special purpose controller, or another suitable processing unit. The hub controller 312 may also include a non-transitory computer readable storage element, such as a semiconductor memory, a magnetic memory, or another suitable memory. This non-transitory storage element may contain instructions and other data that allows the hub controller 312 to perform the functions described herein.

The hub controller 312 receives communication signals 326 that pass through the spindle assembly 340. These communication signals may be generated by controller 180, shown in FIGS. 1A-1B. Based on these communication signals, the hub controller 312 may perform a variety of functions. For example, the hub controller 312 may control one or more rotary motors 313 to cause them to rotate to a predetermined angle. Further, the hub controller 312 may control the operation of the electrode power system 311 using electrode control signals 318. Additionally, the hub controller 312 may receive status signals 319 from the electrode power system 311 and provide this information to the controller 180.

Figure 4:
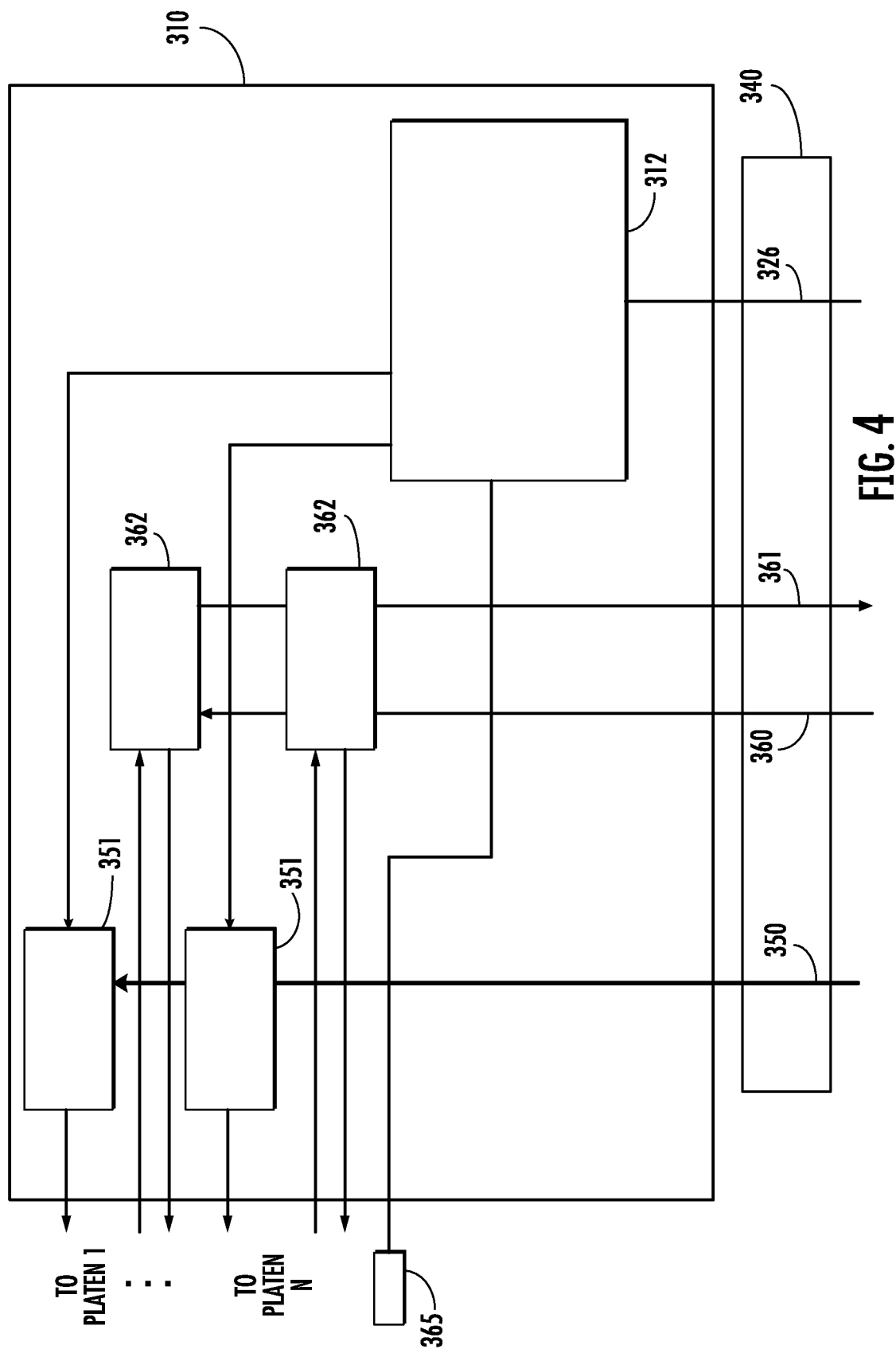
FIG. 4 shows a block diagram of the fluid connections within the central hub.

Additionally, the hub controller 312 may control valves for fluid flow to the platens 320. FIG. 4 shows a block diagram showing possible fluid flow paths. The hub controller 312 may control the flow of backside gas to each platen 320. For example, a fluid conduit 350 may pass through the spindle assembly 340 that carries backside gas. This fluid conduit 350 may then branch to each of the platens 320. In certain embodiments, the flow of backside gas to each platen 320 is independently controlled by the hub controller 312 through the use of a plurality of gas valves

351. In another embodiment, one gas valve 351 may be used to control the flow of backside gas to all of the platens 320.

The hub controller 312 may also control the flow of coolant to each platen 320. An inlet coolant conduit 360 and an outlet coolant conduit 361 may pass through the spindle assembly 340. In certain embodiments, the flow of coolant to each platen 320 is independently controlled by the hub controller 312 through the use of a plurality of coolant valves 362. In another embodiment, one coolant valve 362 may be used to control the flow of coolant to all of the platens 320.

In another embodiment, coolant valves 362 may not be used in the central hub 310. Rather, the flow of coolant to the platens 320 may be controlled outside of the central hub, such as by a coolant supply chiller.

The hub controller 312 may also monitor the temperature of each platen 320, such as through the use of thermal sensors 365. For example, the flow of coolant through the coolant valve 362 may be related to the temperature of the respective platen 320, as measured by the thermal sensor 365. Additionally, the hub controller 312 may also provide status and other information back to the controller 180.

In the case where there are no coolant valves 362 in the central hub 310, the hub controller 312 may provide the temperature information to the controller 180. The controller 180 may then use this information to control the coolant supply chiller.

Thus, again, rather than supplying a plurality of control signals from the controller 180 to the rotary motors 313 and the electrode power system 311, the controller 180 passes only a limited number of communication signals 326 to the hub controller 312. In some embodiments, the number of communication signals 326 may be 16 or less. In other embodiments, the number of communication signals 326 may be 8 or less.

The system and method described herein have many advantages. Traditional batch implant systems rely on mechanical clamping due to the complexity of routing the large number of high voltage signal needed for electrostatic clamping. This typically also implies that the angle at which the workpieces are positioned is fixed in these traditional batch implant systems. By disposing the electrode power system 311 and a hub controller 312 in the central hub 310, which rotates, the number of signals that pass through the spindle assembly is greatly reduced. For example, for certain electrostatic clamps, there are six high voltage signals for each platen. Thus, a spinning disk with a plurality of platens would need more high voltage signals than can be effectively passed through a spindle assembly. This allows the creation of batch implant systems that utilize electrostatic clamping and can achieve implants at an arbitrary implant angle. Further, the inclusion of a hub controller allows additional functions, such as backside gas control, temperature monitoring and other functions, to be performed without increasing the number of signals passing through the spindle assembly.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A spinning disk to process a plurality of workpieces, comprising:
    a central hub adapted to rotate;
    a plurality of platens attached to the central hub, each platen comprising a plurality of electrodes and configured to electrostatically clamp a respective workpiece;
    an electrode power system disposed within the central hub to receive a power signal and generate electrode signals to power the plurality of electrodes disposed within each of the plurality of platens to provide electrostatic clamping; and
    a spindle assembly connecting the central hub to a structure, wherein the power signal is passed through the spindle assembly to the electrode power system.

2. The spinning disk of claim 1, wherein the power signal is less than 500V.

3. The spinning disk of claim 2, wherein the power signal is 24V.

4. The spinning disk of claim 1, wherein the signals generated by the electrode power system to power the plurality of electrodes have an amplitude of greater than or equal to 200V.

5. The spinning disk of claim 4, wherein the amplitude is between 200 and 4000 V.

6. The spinning disk of claim 1, wherein the electrode power system comprises an electrode power supply that creates N*P electrode signals, where N is a number of electrodes disposed in each platen and P is a number of platens.

7. The spinning disk of claim 1, wherein the electrode power system comprises a plurality of electrode power supplies, wherein the plurality of electrode power supplies create N*P electrode signals, where N is a number of electrodes disposed in each platen and P is a number of platens.

8. The spinning disk of claim 7, wherein the plurality of electrode power supplies comprises P electrode power supplies.

9. The spinning disk of claim 1, wherein the electrode power system generates N signals, where N is a number of electrodes, and each of the N signals is branched and distributed to a respective electrode in each platen, and wherein each branch comprises a current sensor, such that there are N*P current sensors, wherein P is a number of platens.

10. An ion implantation system, comprising:
    an ion source;
    an accelerator to accelerate ions from the ion source; and
    the spinning disk of claim 1.

11. A spinning disk to process a plurality of workpieces, comprising:
    a central hub adapted to rotate;
    a plurality of platens attached to the central hub, each platen comprising a plurality of electrodes and configured to electrostatically clamp a respective workpiece;
    a hub controller disposed within the central hub; and
    a spindle assembly connecting the central hub to a structure, wherein communication signals are passed through the spindle assembly to the hub controller.

12. The spinning disk of claim 11, further comprising a fluid gas conduit passing through the spindle assembly and a gas valve disposed in the central hub, wherein the hub controller controls the gas valve to regulate a flow of backside gas to the plurality of platens.

13. The spinning disk of claim 11, further comprising an inlet coolant conduit and an outlet coolant conduit passing through the spindle assembly.

14. The spinning disk of claim 13, further comprising a coolant valve disposed in the central hub, wherein the hub controller controls a temperature of the plurality of platens by controlling the coolant valve.

15. The spinning disk of claim 14, further comprising a thermal sensor disposed in a platen, wherein the hub controller controls the temperature of the platen based on information from the thermal sensor.

16. The spinning disk of claim 13, further comprising a thermal sensor disposed in a platen, wherein the hub controller passes temperature information about the plurality of platens using the communication signals and a temperature of a coolant is controlled based on the temperature information.

17. The spinning disk of claim 11, further comprising spokes extending radially from the central hub, wherein one of the plurality of platens is disposed at a distal end of each spoke, wherein the spokes are configured to rotate about an axis that extends radially from the central hub, and further comprising a plurality of rotary motors, each in communication with a respective spoke, wherein the hub controller controls a rotation of each spoke.

18. An ion implantation system, comprising:
   an ion source;
   an accelerator to accelerate ions from the ion source; and
   the spinning disk of claim 11.

* * * * *